(12) United States Patent
Lakshmanan et al.

(10) Patent No.: US 12,104,243 B2
(45) Date of Patent: Oct. 1, 2024

(54) METHODS AND APPARATUS FOR PROCESSING A SUBSTRATE

(71) Applicant: Applied Materials, Inc., Santa Clara, CA (US)

(72) Inventors: Annamalai Lakshmanan, Fremont, CA (US); Jacqueline S. Wrench, San Jose, CA (US); Feihu Wang, San Jose, CA (US); Yixiong Yang, Santa Clara, CA (US); Joung Joo Lee, San Jose, CA (US); Srinivas Gandikota, Santa Clara, CA (US); Sang-heum Kim, Mountain View, CA (US); Zhebo Chen, San Jose, CA (US); Gang Shen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 550 days.

(21) Appl. No.: 17/348,849

(22) Filed: Jun. 16, 2021

(65) Prior Publication Data

US 2022/0403505 A1 Dec. 22, 2022

(51) Int. Cl.
*C23C 14/02* (2006.01)
*C23C 14/06* (2006.01)
(Continued)

(52) U.S. Cl.
CPC ........ *C23C 16/0281* (2013.01); *C23C 14/021* (2013.01); *C23C 14/025* (2013.01);
(Continued)

(58) Field of Classification Search
CPC . C23C 14/021; C23C 14/025; C23C 14/0682; C23C 14/5886; C23C 16/06; C23C 16/42; C23C 16/45527
See application file for complete search history.

(56) References Cited

U.S. PATENT DOCUMENTS 6,194,314 B1 * 2/2001 Karcher .................. C23C 16/42
257/E21.582
6,219,207 B1 * 4/2001 Pinarbasi ............. G11B 5/3903
(Continued)

FOREIGN PATENT DOCUMENTS

KR 1020130101879 * 9/2013 ............ H01L 21/28
WO WO 2014/125950 A1 * 8/2014 ........... H01L 21/336

OTHER PUBLICATIONS

Jung, Yeonwoong, et al., "Metal Seed Layer Thickness-Induced Transition From Vertical to Horizontal Growth of MoS2 and WS2". Nano Letters 2014, 14, 8842-6849.*
(Continued)

*Primary Examiner* — Bret P Chen
(74) *Attorney, Agent, or Firm* — MOSER TABOA

(57) ABSTRACT

Methods and apparatus for processing a substrate is provided herein. For example, a method for processing a substrate comprises depositing a silicide layer within a feature defined in a layer on a substrate, forming one of a metal liner layer or a metal seed layer atop the silicide layer within the feature via depositing at least one of molybdenum (Mo) or tungsten (W) using physical vapor deposition, and depositing Mo using at least one of chemical vapor deposition or atomic layer deposition atop the at least one of the metal liner layer or the metal seed layer, without vacuum break.

20 Claims, 3 Drawing Sheets

(51) Int. Cl.
  *C23C 14/16* (2006.01)
  *C23C 14/58* (2006.01)
  *C23C 16/02* (2006.01)
  *C23C 16/06* (2006.01)
  *C23C 16/42* (2006.01)
  *C23C 16/455* (2006.01)
  *C23C 16/52* (2006.01)
  *C23C 16/56* (2006.01)

(52) U.S. Cl.
  CPC .......... *C23C 14/0682* (2013.01); *C23C 14/16* (2013.01); *C23C 14/5886* (2013.01); *C23C 16/0227* (2013.01); *C23C 16/06* (2013.01); *C23C 16/42* (2013.01); *C23C 16/45527* (2013.01); *C23C 16/52* (2013.01); *C23C 16/56* (2013.01)

(56) References Cited

U.S. PATENT DOCUMENTS

| | | | |
|---|---|---|---|
| 7,211,144 | B2 | 5/2007 | Lu et al. |
| 7,459,392 | B2* | 12/2008 | Johnston ............ H01L 21/7685 438/650 |
| 8,709,948 | B2 | 4/2014 | Danek et al. |
| 9,240,347 | B2* | 1/2016 | Chandrashekar ............................ H01L 21/76879 |
| 2002/0100418 | A1 | 8/2002 | Sandhu et al. |
| 2005/0085070 | A1* | 4/2005 | Park ................. H01L 21/76856 257/E21.586 |
| 2008/0251851 | A1* | 10/2008 | Pan ..................... H01L 29/7843 257/E29.345 |
| 2009/0004850 | A1* | 1/2009 | Ganguli ............ C23C 16/45523 438/655 |
| 2009/0045704 | A1* | 2/2009 | Barber .................. H03H 9/131 29/25.35 |
| 2015/0206828 | A1 | 7/2015 | Sakata et al. |
| 2016/0035620 | A1* | 2/2016 | Song ................ H01L 23/53238 438/654 |
| 2016/0276214 | A1* | 9/2016 | Fu ..................... H01L 21/76865 |
| 2016/0300693 | A1* | 10/2016 | Jiang ....................... H03H 3/02 |
| 2017/0133231 | A1 | 5/2017 | Bamnolker et al. |
| 2017/0148739 | A1 | 5/2017 | Roberts et al. |
| 2017/0350013 | A1 | 12/2017 | Chan et al. |
| 2018/0286668 | A1 | 10/2018 | Baum et al. |
| 2018/0330951 | A1* | 11/2018 | Kulshreshtha ...... H01L 21/2257 |
| 2020/0357643 | A1* | 11/2020 | Kulshreshtha .... C23C 16/45538 |
| 2021/0123139 | A1 | 4/2021 | Zhou et al. |
| 2021/0151352 | A1 | 5/2021 | Zope et al. |

OTHER PUBLICATIONS

Buijnsters, J.G., et al., "Enhancement of the nucleation of smooth and dense nanocrystalline diamond films by using molybdenum seed layers". J. Appl. Phys. 108, 103514 (2010), pp. 1-9.*
International Search Report for PCT/US2022/028451, dated Aug. 30, 2021.

* cited by examiner

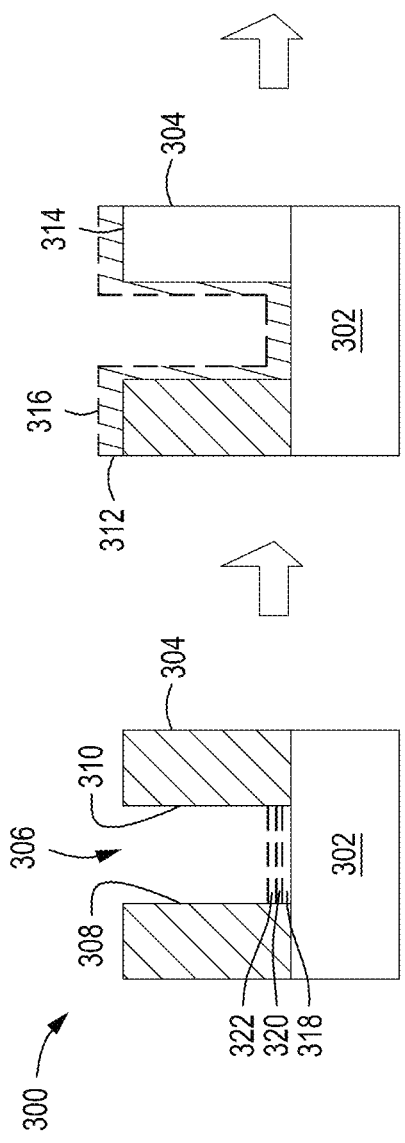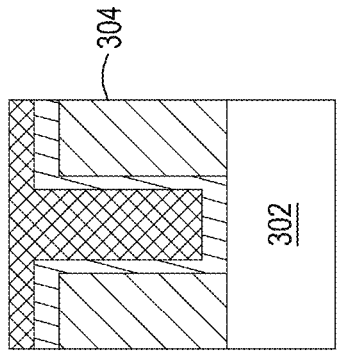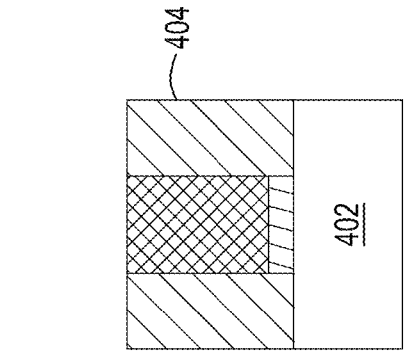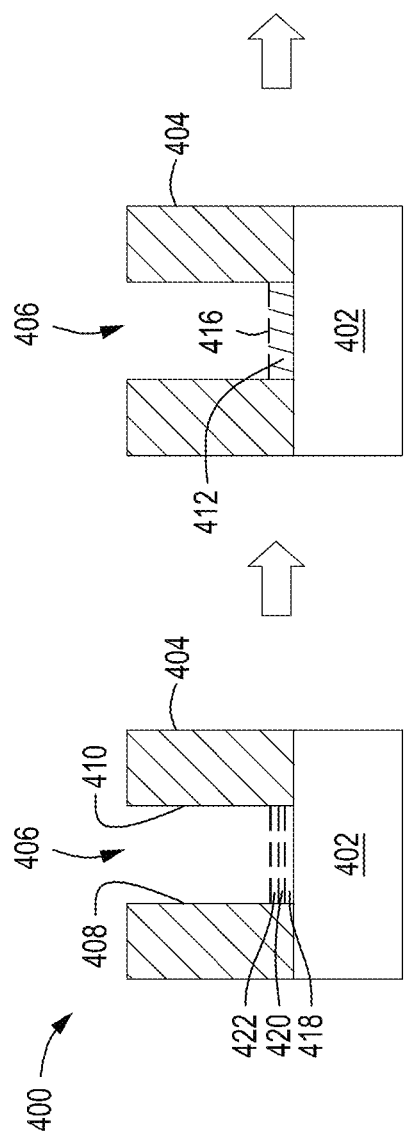

METHODS AND APPARATUS FOR PROCESSING A SUBSTRATE

FIELD

Embodiments of the present disclosure generally relate to a methods and apparatus for processing a substrate, and more particularly, to methods and apparatus for integrated low resistivity middle end of the line (MEOL) metallization.

BACKGROUND

Conventional MEOL metallization processes, typically, comprise forming one or more metal film stacks on a substrate that can include a feature (e.g., via, trench, etc.) recessed from a field region on the substrate. For example, in some instances, a metal liner layer or a metal seed layer can be deposited within the feature on the substrate using, for example, physical vapor deposition (PVD). Thereafter, the substrate can be transferred from the PVD processing chamber (reactor) to another processing chamber (reactor) so that a subsequent metal layer can deposited using, for example, chemical vapor deposition (CVD) and/or atomic layer deposition (ALD). During transfer from the PVD processing chamber to the CVD and/or the ALD processing chamber, however, oxidation can sometimes develop on the metal liner layer or a metal seed layer. Accordingly, one or more oxidation processes is sometimes be performed to remove the oxidation (e.g., to improve gapfill performance and reduce stack resistivity of a fabricated substrate). As can be appreciated, having to perform the one or more oxidation processes can increase fabrication costs and decrease throughput.

SUMMARY

Methods and apparatus for processing a substrate (e.g., metal fill) are provided herein. For example, a method for processing a substrate comprises depositing a silicide layer within a feature defined in a layer on a substrate, forming one of a metal liner layer or a metal seed layer atop the silicide layer within the feature via depositing at least one of molybdenum (Mo) or tungsten (W) using physical vapor deposition, and depositing Mo using at least one of chemical vapor deposition or atomic layer deposition atop the at least one of the metal liner layer or the metal seed layer, without vacuum break.

In accordance with at least some embodiments, a non-transitory computer readable storage medium has stored thereon instructions that when executed by a processor performs a method for processing a substrate comprising depositing a silicide layer within a feature defined in a layer on a substrate, forming one of a metal liner layer or a metal seed layer atop the silicide layer within the feature via depositing at least one of molybdenum (Mo) or tungsten (W) using physical vapor deposition, and depositing Mo using at least one of chemical vapor deposition or atomic layer deposition atop the at least one of the metal liner layer or the metal seed layer, without vacuum break.

In accordance with at least some embodiments, a method for processing a substrate comprises performing a pre-clean process on a substrate comprising a layer having a feature defined therein, forming one of a metal liner layer or a metal seed layer within the feature via depositing at least one of molybdenum (Mo) or tungsten (W) using physical vapor deposition, depositing a nucleation layer atop the one of the metal liner layer or the metal seed layer, and depositing Mo using at least one of chemical vapor deposition or atomic layer deposition atop the one of the metal liner layer or the metal seed layer to one of selectively fill or conformally fill the feature, without vacuum break.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 3A-3C are diagrams illustrating a processing sequence of the method of FIG. 1, in accordance with at least some embodiments of the present disclosure.

FIGS. 4A-4C are diagrams illustrating a processing sequence of the method of FIG. 1, in accordance with at least some embodiments of the present disclosure.

Figure 1:
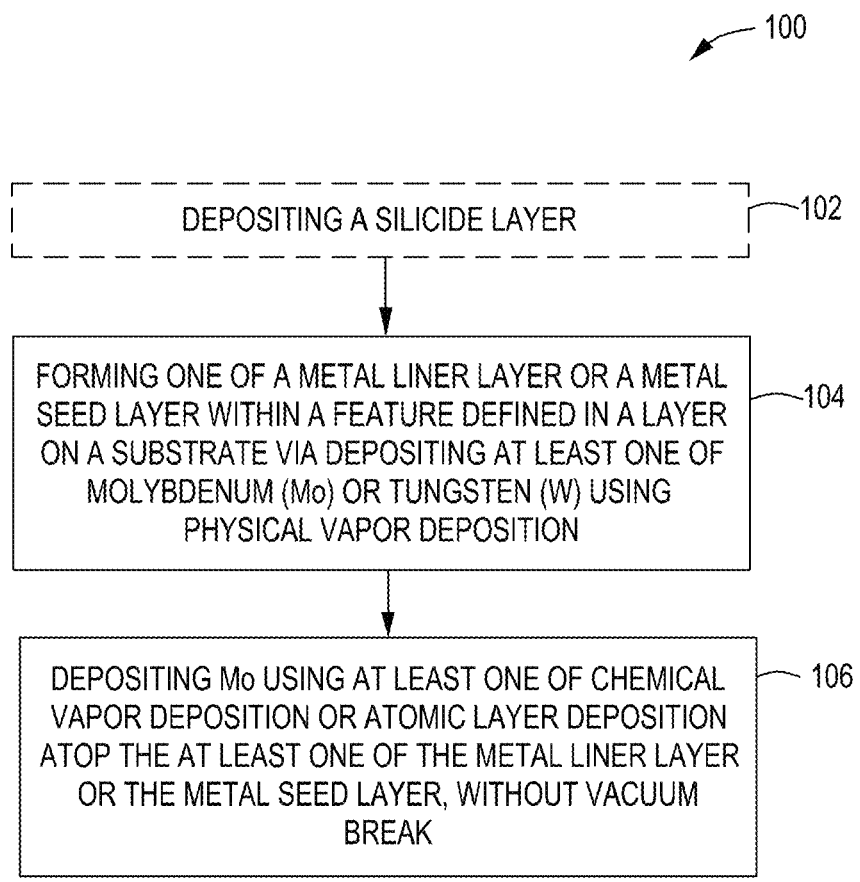
FIG. 1 is a flowchart of a method for processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, in at least some embodiments, the methods and apparatus described herein are configured to deposit a silicide layer within a feature defined in a layer on a substrate. Next, a metal liner layer or a metal seed layer can be deposited within the feature. For example, in at least some embodiments, PVD can be used to deposit the metal liner layer or a metal seed layer within the feature. Thereafter, one or more additional metals can be deposited on the metal liner layer or a metal seed layer. For example, in at least some embodiments, CVD and/or ALD can be used to deposit the one or more additional metals atop the metal liner layer or the metal seed layer, without vacuum break, which substantially reduces, if not eliminates, oxidation from forming on the metal liner layer or the metal seed layer. Accordingly, conventional oxidation processes need not be used with the methods described herein, which, in turn, results in a decrease in overall fabrication costs of a substrate and an increase in throughput, when compared to conventional fabrication processes.

Figure 2:
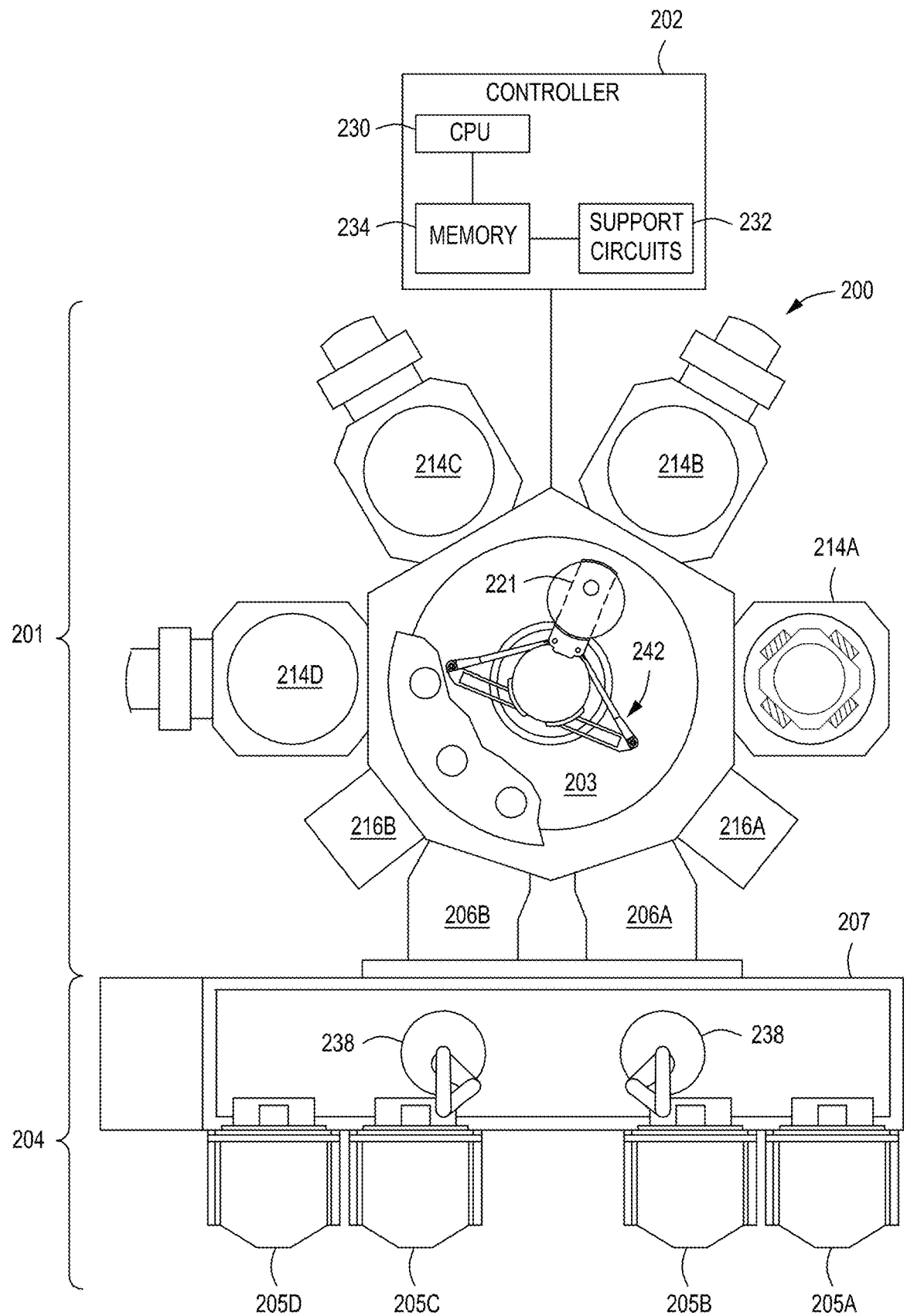
FIG. 2 is a schematic diagram of an apparatus for processing a substrate, in accordance with at least some embodiments of the present disclosure.

FIG. 1 is a flowchart of a method 100 for processing a substrate, and FIG. 2 is a tool 200 (or apparatus) that can used for carrying out the method 100, in accordance with at least some embodiments of the present disclosure.

The method 100 may be performed in the tool 200 including any suitable processing chambers configured for one or more of physical vapor deposition (PVD), chemical vapor deposition (CVD) and/or atomic layer deposition (ALD), such as plasma enhanced ALD or thermal ALD (e.g., no plasma formation). Exemplary processing systems that may be used to perform the inventive methods disclosed herein are commercially available from Applied Materials, Inc., of Santa Clara, California Other process chambers, including those from other manufacturers, may also be suitably used in connection with the teachings provided herein.

The tool 200 can be embodied in individual process chambers that may be provided in a standalone configuration or as part of a cluster tool, for example, an integrated tool described below with respect to FIG. 2. Examples of the integrated tool include the line of integrated tools, available from Applied Materials, Inc., of Santa Clara, California. The methods described herein may be practiced using other cluster tools having suitable processing chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of a metal liner layer, metal seed layer, or other portions of a substrate.

The integrated tool includes a processing platform 201 (vacuum-tight processing platform), a factory interface 204, and a system controller 202. The processing platform 201 comprises multiple process chambers, such as 214A, 214B, 214C, and 214D operatively coupled to a transfer chamber 203 (vacuum substrate transfer chamber). The factory interface 204 is operatively coupled to the transfer chamber 203 by one or more load lock chambers (two load lock chambers, such as 206A and 206B are shown in FIG. 2).

In some embodiments, the factory interface 204 comprises a one docking station 207, a factory interface robot 238 to facilitate the transfer of the substrate 221 (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates 221 from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chamber 206A and 206B are coupled to a pressure control system (not shown) which pumps down and vents the load lock chambers 206A and 206B to facilitate passing the substrates 221 between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring the substrates 221 between the load lock chamber 206A and 206B and the process chambers 214A, 214B, 214C, and 214D.

The process chambers 214A, 214B, 214C, and 214D comprise at least an ALD chamber, a CVD chamber, a PVD chamber, an e-beam deposition chamber, pre-cleaning chamber, and/or an electroplating, electroless (EEP) deposition chamber.

In some embodiments, one or more optional service chambers (shown as 216A and 216B) may be coupled to the transfer chamber 203. The service chambers 216A and 216B may be configured to perform other substrate processes, such as degassing, bonding, chemical mechanical polishing (CMP), wafer cleaving, etching, plasma dicing, orientation, substrate metrology, cool down and the like.

The system controller 202 controls the operation of the tool 200 using a direct control of the process chambers 214A, 214B, 214C, and 214D or alternatively, by controlling the computers (or controllers) associated with the process chambers 214A, 214B, 214C, and 214D and the tool 200. In operation, the system controller 202 enables data collection and feedback from the respective chambers and systems to optimize performance of the tool 200. The system controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described herein may be stored in the memory 234 (e.g., non-transitory computer readable storage medium having instructions stored thereon) and, when executed by the central processing unit 230, transform the central processing unit 230 into a specific purpose computer (the system controller 202). The software routines may also be stored and/or executed by a second controller (not shown) that is located remotely from the tool 200.

Continuing with reference to FIG. 1, and with reference to FIG. 3, initially one or more substrates 300 (e.g., the substrate 221) may be loaded into one or more of the Four FOUPS, such as 205A, 205B, 205C, and 205D (FIG. 3A). For example, in at least some embodiments, the substrate 300 can comprise a base layer 302 that can be made from one or more materials suitable for disposing a field layer 304 on. For example, in at least some embodiments, the base layer 302 can be formed from at least one of silicon, glass, or metal substrate made from aluminum, copper, stainless steel, tungsten, titanium, molybdenum, cobalt, etc. Similarly, the field layer 304 can be formed from one or more dielectrics. For example, in at least some embodiments, the field layer 304 can be a dielectric such as silicon oxide or silicon nitride. One or more features 306 (e.g., a trench, a via, or a dual damascene structure) can be recessed in the field layer 304. The one or more features 306 can have a first sidewall 308 and an opposing second sidewall 310.

Once loaded, the factory interface robot 238 can transfer the substrate 300 from the factory interface 204 to the processing platform 201 through, for example, the load lock chamber 206A. The vacuum robot 242 can transfer the substrate 300 from the load lock chamber 206A to and from one or more of the processing chambers 214A-214D and/or the service chambers 216A and 216B.

In at least some embodiments, the method 100 can comprise performing an optional pre-clean process on the substrate, wherein the pre-clean process uses at least one of hydrogen plasma or fluorine plasma, and wherein the one of hydrogen plasma or fluorine plasma is formed using one of a capacitively coupled plasma source, an inductively coupled plasma source, or remote plasma source. For example, the vacuum robot 242 can transfer the substrate to the processing chamber 214A.

Next, in at least some embodiments, at 102, the method 100 can comprise optionally depositing a silicide layer 318/418 comprising at least one of silane ($SiH_4$) and cobalt (Co), $SiH_4$ and Mo, $SiH_4$ and ruthenium (Ru), or $SiH_4$ and W within a feature defined in a layer (e.g., a field layer 304) on a substrate 300 (see FIG. 3A, for example). For example, the vacuum robot 242 can transfer the substrate from the processing chamber 214A to the processing chamber 214B (with or without vacuum break) so that the silicide layer can be deposited using CVD and/or ALD. Next, in at least some embodiments the method 100 comprises performing PVD to optionally deposit a metal cap layer 320, 420 comprising at least one of Co, Mo, Ru, or W within the feature atop the silicide layer. For example, the vacuum robot 242 can transfer the substrate from the processing chamber 214B to the processing chamber 214C (with or without vacuum break). In such embodiments, the metal cap layer can have a thickness of about 30 A to about 100 A, e.g., 60 A. Next, the method 100 comprises optionally performing at least one of ALD and/or CVD to deposit a Mo layer 322, 422 atop the metal cap layer 320, 420 within the feature, without vacuum break. For example, the vacuum robot 242 can transfer the substrate from the processing chamber 214C back to the processing chamber 214B (with or without vacuum break).

At 104, the method 100 comprises forming one of a metal liner layer or a metal seed layer within a feature defined in a layer on a substrate via depositing at least one or more metals using PVD (FIG. 3B). For example, in at least some embodiments, the factory interface robot 238 can transfer (with or without vacuum break) the substrate 300 to the processing chamber 214C to deposit, via PVD, a metal liner layer 312 on the field layer 304. In at least some embodiments, the metal liner layer can be molybdenum (Mo) and/or tungsten (W), or other suitable metal. At 104, the process parameters can include providing a pressure of about 100 mTorr to about 400 mTorr, a temperature of about room temperature to about 400° C., an RF power from about 1000 W to about 40,000 W (e.g., at a frequency of about 40 MHz), an RF bias of about 50 W to about 200 W (e.g., at a RF frequency 13.56 MHz). The metal liner layer 312 can be deposited to cover at least a portion of the first sidewall 308, the second sidewall 310, a top surface of a base layer 302 or on a bottom surface of the feature 306, and a top surface 314 of the field layer 304. In at least some embodiments, the metal liner layer 312 can be deposited to cover the silicide layer 318 when used.

Alternatively, in at least some embodiments, at 104, a metal seed layer 412 can be deposited on a top surface of a base layer 402 (e.g., the base layer 302) of a substrate 400 or on a bottom surface of a feature 406 recessed in a field layer 404 (e.g., the field layer 404), which can have a first sidewall 408 and an opposing second sidewall 410 (FIGS. 4A and 4B). In at least some embodiments, the metal seed layer 412 can be deposited to cover the silicide layer 418 when used. The metal seed layer 412 can be performed under the same process parameters as the metal liner layer 312.

Next, at 106, the method 100 comprises depositing Mo using at least one of CVD or ALD atop the at least one of the metal liner layer or the metal seed layer, without vacuum break. In at least some embodiments, 106 can be performed without first performing oxidation reduction by exposing the at least one of Mo or W to hydrogen, e.g., due to maintaining vacuum. The factory interface robot 238 can transfer the substrate 300 from the processing chamber 214C to the processing chamber 214B to deposit, via CVD and/or ALD, Mo. In at least some embodiments, the Mo is deposited, via CVD and/or ALD, atop the metal liner layer 312 to conformally fill the feature 306 (FIG. 3C). For example, the Mo is deposited to cover or substantially cover the metal liner layer 312 (e.g., the metal liner layer 312 deposited on the first sidewall 308, the second sidewall 310, on a top surface of a base layer 302 or on a bottom surface of the feature 306, and a top surface 314 of the field layer 304). At 106, the process parameters can comprise providing a pressure of about 10 Torr to about 60 Torr, a temperature of about 350° C. to about 400° C., a showerhead to substrate spacing of about 190 mils to about 450 mils, a gas flow precursor of argon carrier gas with a flow rate of about 500 sccm to about 3000 sccm and hydrogen reactive gas with a flow rate of about 1000 sccm to about 10000 sccm.

Alternatively, in at least some embodiments, the Mo is deposited, via CVD and/or ALD, atop the metal seed layer 412 to selectively fill the feature 406 (FIG. 4C), e.g., to develop/grow Mo on the metal seed layer 412 and/or enhance gapfill performance.

In at least some embodiments, prior to 106, the method 100 comprises depositing a nucleation layer (a nucleation layer 316 or a nucleation layer 416) atop the one of the metal liner layer 312 or the metal seed layer 412 (shown by dashed lines in FIGS. 3B and 4B). For example, the nucleation layer can be deposited to facilitate growing of the Mo during CVD or ALD at 104.

In at least some embodiments, after 106, the method 100 comprises performing PVD to deposit additional Mo atop the Mo deposited atop the one of the metal liner layer or the metal seed layer to one of selectively fill or conformally fill the feature, without vacuum break. In such embodiments, the additional Mo can be deposited to a thickness of about 2000 A. In at least some embodiments, after PVD to deposit the additional Mo, the method 100 comprises performing chemical mechanical polishing on the additional Mo.

While the foregoing is directed to embodiments of the present disclosure, other and further embodiments of the disclosure may be devised without departing from the basic scope thereof.

The invention claimed is:

1. A method for processing a substrate, comprising:
   depositing a silicide layer within a feature defined in a layer on a substrate;
   forming one of a metal liner layer or a metal seed layer atop the silicide layer within the feature via depositing at least one of molybdenum (Mo) or tungsten (W) using physical vapor deposition; and
   depositing Mo using at least one of chemical vapor deposition or atomic layer deposition atop the at least one of the metal liner layer or the metal seed layer, without vacuum break.

2. The method of claim 1, wherein the feature is one of a trench, a via, or a dual damascene structure, and wherein the Mo is deposited atop the one of the metal liner layer or the metal seed layer to one of selectively fill or conformally fill the feature.

3. The method of claim 2, wherein, prior to performing the at least one of chemical vapor deposition or atomic layer deposition to deposit Mo to one of selectively fill or conformally fill the feature, further comprising depositing a nucleation layer atop the one of the metal liner layer or the metal seed layer.

4. The method of claim 3, further comprising performing physical vapor deposition to deposit additional Mo atop the Mo deposited atop the one of the metal liner layer or the metal seed layer to one of selectively fill or conformally fill the feature, without vacuum break, wherein the additional Mo is deposited to a thickness of about 2000 A.

5. The method of claim 4, further comprising performing chemical mechanical polishing on the additional Mo.

6. The method of claim 1, further comprising, prior to forming the one of the metal liner layer or the metal seed layer, performing a pre-clean process on the substrate, wherein the pre-clean process uses at least one of hydrogen plasma or fluorine plasma, and wherein the one of hydrogen plasma or fluorine plasma is formed using one of a capacitively coupled plasma source, an inductively coupled plasma source, or remote plasma source.

7. The method of claim 1, wherein the silicide layer comprises at least one of silane ($SiH_4$) and cobalt (Co), $SiH_4$ and Mo, $SiH_4$ and ruthenium (Ru), or $SiH_4$ and W, without vacuum break.

8. The method of claim 7, further comprising performing physical vapor deposition to deposit a metal cap layer comprising at least one of Co, Mo, Ru, or W within the feature atop the silicide layer, wherein the metal cap layer has a thickness of about 30 A to about 100 A.

9. The method of claim 8, further comprising performing at least one of atomic layer deposition or chemical vapor deposition to deposit Mo atop the metal cap layer within the feature, without vacuum break.

10. The method of claim 9, wherein the one of the metal liner layer or the metal seed layer is deposited on the metal cap layer within the feature.

11. The method of claim 1, wherein depositing Mo using at least one of chemical vapor deposition or atomic layer deposition is performed without first performing oxidation reduction by exposing the at least one of Mo or W to hydrogen.

12. A non-transitory computer readable storage medium having stored thereon instructions that when executed by a processor performs a method for processing a substrate, comprising:
   depositing a silicide layer within a feature defined in a layer on a substrate;
   forming one of a metal liner layer or a metal seed layer atop the silicide layer within the feature via depositing at least one of molybdenum (Mo) or tungsten (W) using physical vapor deposition; and
   depositing Mo using at least one of chemical vapor deposition or atomic layer deposition atop the at least one of the metal liner layer or the metal seed layer, without vacuum break.

13. The non-transitory computer readable storage medium of claim 12, wherein the feature is one of a trench, a via, or a dual damascene structure, and wherein the Mo is deposited atop the one of the metal liner layer or the metal seed layer to one of selectively fill or conformally fill the feature.

14. The non-transitory computer readable storage medium of claim 13, wherein, prior to performing the at least one of chemical vapor deposition or atomic layer deposition to deposit Mo to one of selectively fill or conformally fill the feature, further comprising depositing a nucleation layer atop the one of the metal liner layer or the metal seed layer.

15. The non-transitory computer readable storage medium of claim 14, further comprising performing physical vapor deposition to deposit additional Mo atop the Mo deposited atop the one of the metal liner layer or the metal seed layer to one of selectively fill or conformally fill the feature, without vacuum break, wherein the additional Mo is deposited to a thickness of about 2000 A.

16. The non-transitory computer readable storage medium of claim 15, further comprising performing chemical mechanical polishing on the additional Mo.

17. The non-transitory computer readable storage medium of claim 12, further comprising, prior to forming the one of the metal liner layer or the metal seed layer, performing a pre-clean process on the substrate, wherein the pre-clean process uses at least one of hydrogen plasma or fluorine plasma, and wherein the one of hydrogen plasma or fluorine plasma is formed using one of a capacitively coupled plasma source, an inductively coupled plasma source, or remote plasma source.

18. The non-transitory computer readable storage medium of claim 12, wherein the silicide layer comprises at least one of silane ($SiH_4$) and cobalt (Co), $SiH_4$ and Mo, $SiH_4$ and ruthenium (Ru), or $SiH_4$ and W, without vacuum break.

19. The non-transitory computer readable storage medium of claim 18, further comprising performing physical vapor deposition to deposit a metal cap layer comprising at least one of Co, Mo, Ru, or W within the feature atop the silicide layer, wherein the metal cap layer has a thickness of about 30 A to about 100 A.

20. A method for processing a substrate, comprising:
   performing a pre-clean process on a substrate comprising a layer having a feature defined therein;
   forming one of a metal liner layer or a metal seed layer within the feature via depositing at least one of molybdenum (Mo) or tungsten (W) using physical vapor deposition;
   depositing a nucleation layer atop the one of the metal liner layer or the metal seed layer, without vacuum break; and
   depositing Mo using at least one of chemical vapor deposition or atomic layer deposition atop the one of the metal liner layer or the metal seed layer to one of selectively fill or conformally fill the feature, without vacuum break.

* * * * *